(12) United States Patent
McCloud et al.

(10) Patent No.: US 9,196,516 B2
(45) Date of Patent: Nov. 24, 2015

(54) WAFER TEMPERATURE MEASUREMENT TOOL

(71) Applicant: QualiTau, Inc., Sunnyvale, CA (US)

(72) Inventors: Edward McCloud, Castro Valley, CA (US); David VandenBerg, San Mateo, CA (US)

(73) Assignee: Qualitau, Inc., Mountain View, CA (US)

( * ) Notice: Subject to any disclaimer, the term of this patent is extended or adjusted under 35 U.S.C. 154(b) by 330 days.

(21) Appl. No.: 13/827,490

(22) Filed: Mar. 14, 2013

(65) Prior Publication Data

US 2014/0269822 A1    Sep. 18, 2014

(51) Int. Cl.
*G01K 1/00* (2006.01)
*G01K 13/12* (2006.01)
*H01L 21/67* (2006.01)
*G01K 1/14* (2006.01)

(52) U.S. Cl.
CPC .......... *H01L 21/67248* (2013.01); *G01K 1/143* (2013.01); *G01K 1/146* (2013.01)

(58) Field of Classification Search
CPC ............. G01K 1/16; G01K 1/00; G01K 13/12
USPC ....................................................... 374/100
See application file for complete search history.

(56) References Cited

U.S. PATENT DOCUMENTS

| 5,059,032 | A | 10/1991 | Mack et al. | |
| 5,436,494 | A | 7/1995 | Moslehi | |
| 5,446,824 | A * | 8/1995 | Moslehi | 392/416 |
| 6,004,029 | A * | 12/1999 | Moslehi et al. | 374/1 |
| 6,110,288 | A | 8/2000 | Penelon et al. | |
| 6,554,906 | B1 | 4/2003 | Kuibira et al. | |
| 6,572,265 | B1 * | 6/2003 | Gotthold et al. | 374/161 |
| 6,914,222 | B2 | 7/2005 | Nakamura | |
| 7,275,861 | B2 * | 10/2007 | Volf et al. | 374/1 |
| 2008/0034855 | A1 | 2/2008 | Peeters et al. | |
| 2014/0269822 | A1 * | 9/2014 | McCloud et al. | 374/100 |

FOREIGN PATENT DOCUMENTS

| JP | 2001/085488 | 3/2001 |
| JP | 2004/022803 | 1/2004 |
| WO | 97/03342 | 1/1997 |

OTHER PUBLICATIONS

International Search Report dated Jul. 25, 2014 from International Application No. PCT/US2014/018070.
Written Opinion dated Jul. 25, 2014 from International Application No. PCT/US2014/018070.

* cited by examiner

*Primary Examiner* — Lisa Caputo
*Assistant Examiner* — Jamel Williams
(74) *Attorney, Agent, or Firm* — Beyer Law Group LLP

(57) ABSTRACT

A wafer temperature measurement tool for measuring the surface temperature of a semiconductor wafer. The tool can be used to measure temperature on different parts of the wafer to provide a high resolution temperature distribution map. The tool includes an internal calibrated weight that is slidably disposed within a tool body. A temperature sensor is attached to the bottom of the weight. Ceramic stands are attached to the bottom of the tool body. Gravity pulls down on the weight such that the temperature sensor contacts the wafer when the ceramic stands of the tool body are placed on the wafer.

19 Claims, 5 Drawing Sheets

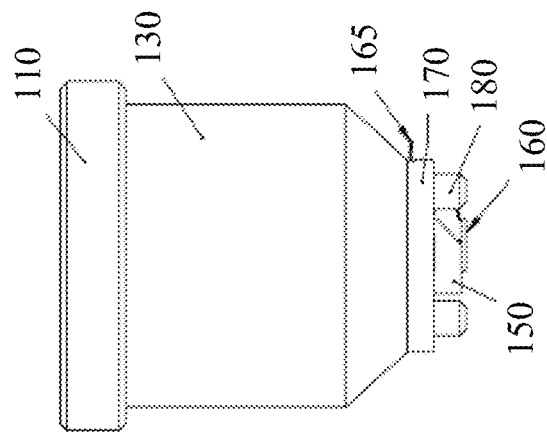
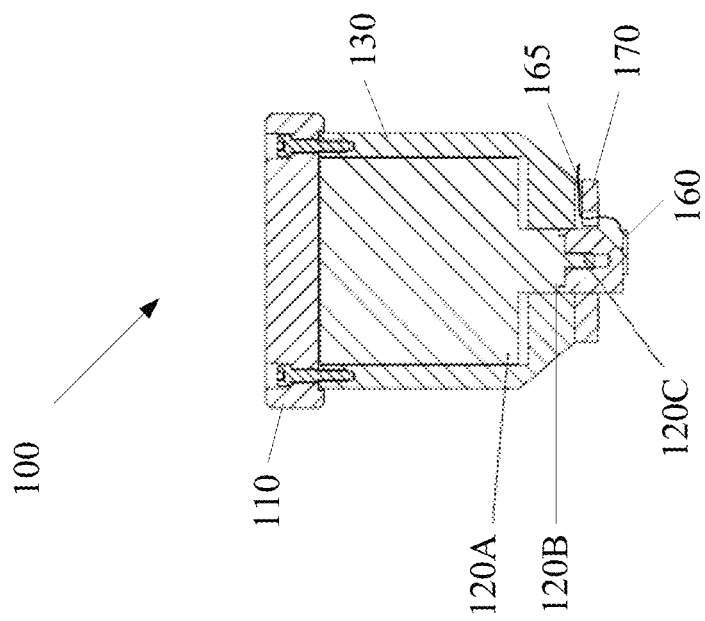
Figure 2B
Figure 2A

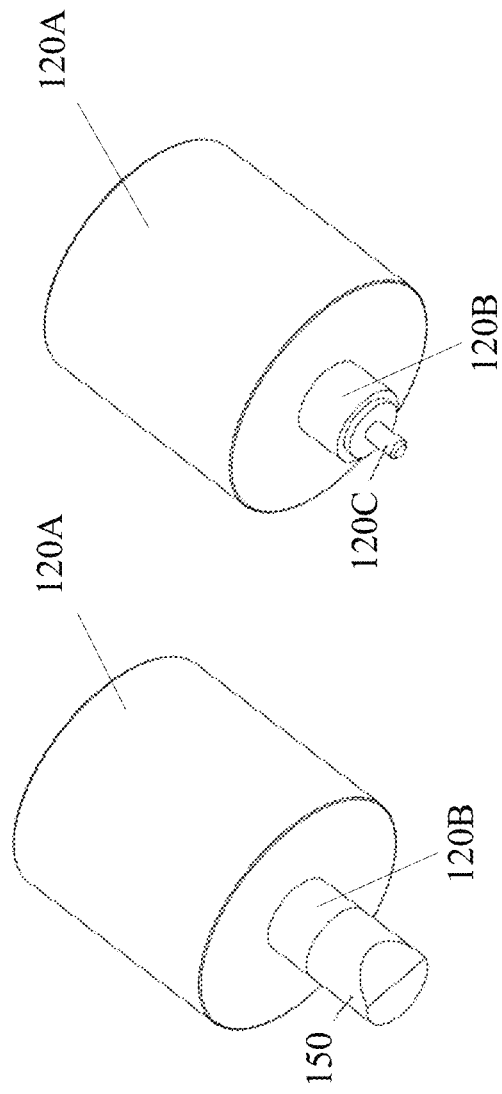

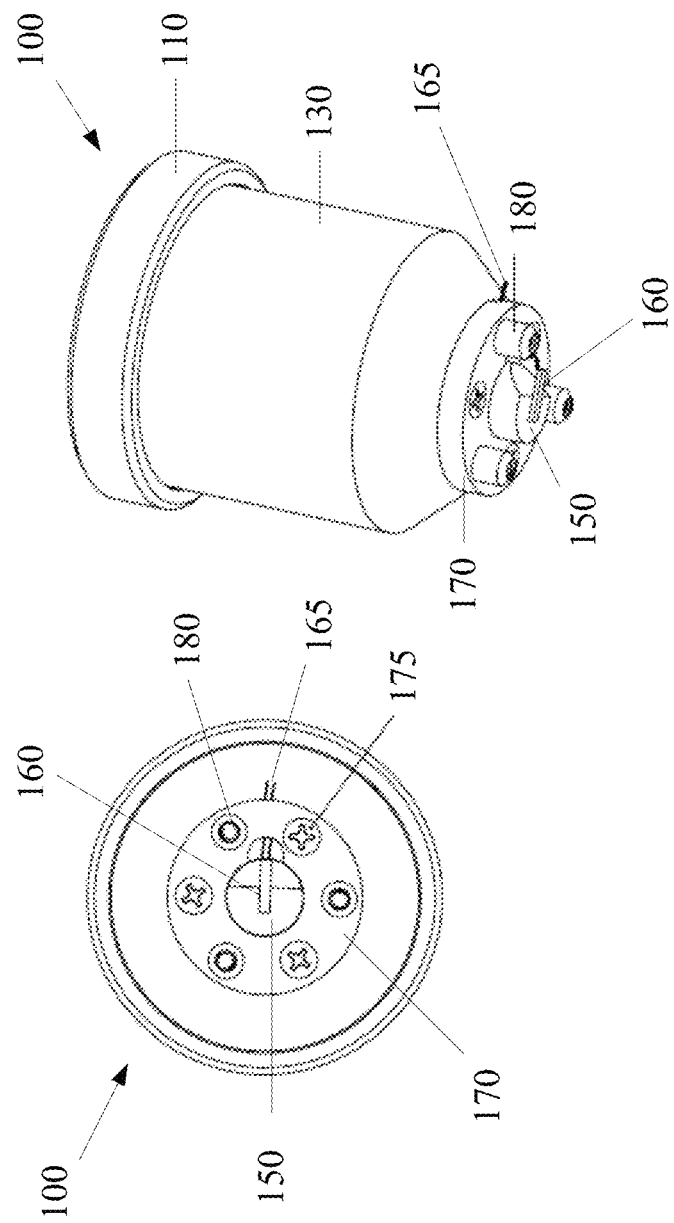

WAFER TEMPERATURE MEASUREMENT TOOL

BACKGROUND

The present invention relates generally to mechanism for measuring the temperature of a hot chuck surface.

Semiconductor reliability tests, which are known as wafer level reliability (WLR) tests, are typically carried out at ambient temperatures as high as 350° C. The duration of such WLR tests can range from several minutes to several weeks. When a WLR test is performed on many dice across a wafer, either sequentially or simultaneously, it is important to maintain the entire wafer at a uniform temperature.

In order to achieve and maintain a uniform temperature across the entire wafer, the temperature of the wafer needs to be measured. A cost-efficient, reliable wafer temperature measurement tool is therefore desirable.

SUMMARY

According to an embodiment, wafer temperature measurement tool is provided. The tool includes a tool body, a calibrated weight, a foot, and a temperature sensor. The calibrated weight is slidably disposed within the tool body. The foot is attached to the bottom end of the calibrated weight and protrudes from the bottom end of the tool body. The temperature sensor extends from the bottom surface of the foot.

According to another embodiment, a method is provided for measuring wafer surface temperature. A temperature measurement tool is placed on the wafer. The tool has a calibrated weight slidably disposed within a tool body and a ceramic foot attached to a bottom end of the calibrated weight. The temperature sensor extends from a bottom surface of the ceramic foot. Gravity is then allowed to pull down the ceramic foot such that the temperature sensor thermally contacts the wafer. A temperature reading is acquired from the temperature sensor.

According to yet another embodiment, a wafer temperature measurement tool is provided. The wafer temperature measurement tool includes a cylindrical tool body, a calibrated weight, ceramic stands, and a temperature sensor. The calibrated weight is slidably disposed within the tool body. The ceramic stands extend from a bottom end of the tool body. The temperature sensor is attached to a ceramic foot on a bottom end of the calibrated weight, and the ceramic foot and temperature sensor are external to the tool body.

BRIEF DESCRIPTION OF THE DRAWINGS

The invention, together with further objects and advantages thereof, may best be understood by reference to the following description taken in conjunction with the accompanying drawings in which:

FIG. 2A is a side cross-sectional view of an embodiment of the wafer surface temperature measurement tool showing the internal calibrated weight within the tool body;

FIG. 2B is a side view of the tool shown in FIG. 2A;

FIG. 3A is a perspective view of an embodiment of the internal calibrated weight with the ceramic foot attached;

FIG. 3B is a perspective view of the internal calibrated weight of FIG. 3A without the ceramic foot attached.

FIG. 4A is a bottom view of an embodiment of the wafer surface temperature measurement tool;

FIG. 4B is a perspective view of an embodiment of the assembled wafer surface temperature measurement tool.

It is to be understood that, in the drawings, like reference numerals designate like structural elements. Also, it is understood that the depictions in the figures are diagrammatic and not to scale.

DETAILED DESCRIPTION OF EMBODIMENTS

Figure 1:
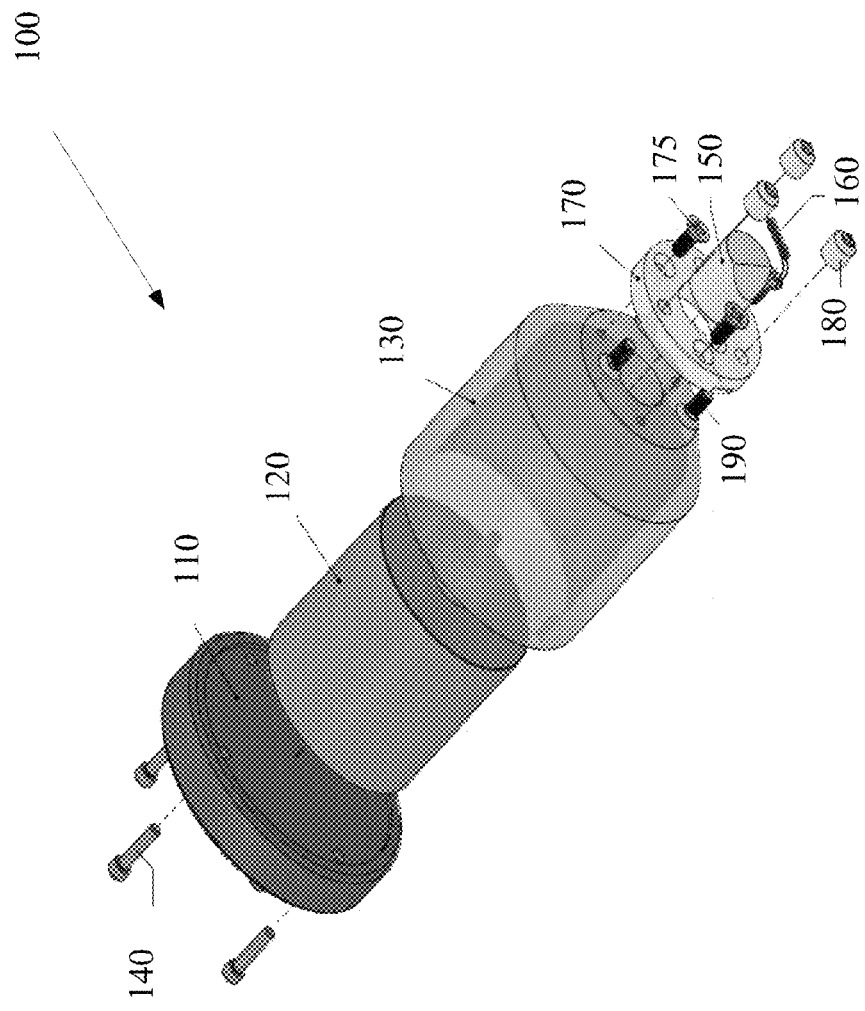
FIG. 1 is an exploded perspective view of a wafer surface temperature measurement tool in accordance with an embodiment.

The present invention relates generally to measuring the temperature across the surface of a semiconductor wafer. As noted above, WLR tests require a wafer to be maintained at a uniform temperature. The embodiments herein describe a wafer surface temperature measurement tool and method for measuring the temperature across a wafer. The tool provides a repeatable, reliable, accurate, and practical temperature calibration method, which is a key element in achieving uniform wafer temperature throughout a WLR test.

The wafer surface temperature measurement tool can be placed on the surface of a heated wafer to accurately acquire the surface temperature of the wafer. The temperature sensor of the tool is relatively small in size, so its contact area with the wafer is minimal. The small contact area allows repeated placement on the wafer to provide high areal resolution, capable of yielding a detailed wafer temperature distribution map.

WLR tests at elevated temperatures (e.g., 25° C.-300° C.) are typically performed on a specially designed metal chuck, usually known as a "hot chuck." The hot chuck is heated by a dedicated control system, which controls the temperature at the top surface of the chuck. The backside of the wafer to be tested is placed over the top surface of the chuck, using small vacuum holes in the chuck to help achieve good physical and thermal contact between the wafer and the chuck. However, the controlled temperature at the top surface of the chuck differs from the actual temperature of the tested devices, which are located at the top surface of the wafer.

In principle, every die (site) across the tested wafer could have a dedicated temperature sensor. If the readings of a number of such temperature sensors covering the entire area of the wafer, are used in conjunction with the dedicated control system, the temperature across the tested devices at the top surface of the wafer could be measured and controlled, rather than at the top surface of the chuck. This approach using multiple temperature sensors across the entire area of the wafer, while theoretically viable, is impractical, because each and every tested wafer would have to be integrated both physically and electronically with a system, including the chuck, multiple temperature sensors, and a dedicated control system.

According to an embodiment described herein, a calibration step takes place prior to the actual wafer level reliability test. During the calibration step, the temperatures across the top surface of the wafer are obtained as a respective array of offset numbers. After calibration, the set chuck temperature is adjusted accordingly, such that the resulting temperature of each tested device is closer to the required value, while the remaining temperature deviation is known and can be taken into account.

There are two common methods of obtaining the surface temperatures across a wafer: (1) using a commercially made silicon calibration wafer; and (2) using a small high-accuracy temperature sensor. When a commercially made silicon calibration wafer is used, multiple high-accuracy temperature sensors, which are embedded in the wafer, are connected via wires to a meter in order to provide a map of the respective readings across the wafer. This method yields accurate and reliable results. However, the calibration wafer is very expensive and wafers that differ from the calibration wafer (e.g. substrate-doping, thickness) are likely to have a different temperature offset between the hot-chuck surface and their surfaces.

When a small, high-accuracy temperature sensor is used, it is applied manually to the wafer by a low thermal conductance tool (e.g., a cotton swab) and moved across the wafer to provide a map of the temperature across the wafer. However, this method is inherently inconsistent because the normal force applied manually to the sensor varies during measurements and among sites across the wafer. The measured temperature is fairly sensitive to this variability, possibly by more than 1.0° C.

The embodiments described herein alleviate the variability of the method using the manually applied temperature sensor described above, by using a constant, calibrated force each time. The resulting low-cost tool is both simple and easy to-use; allowing accurate, consistent, and reliable temperature measurements across a wafer. As a result, it provides an effective temperature calibration prior to most wafer level reliability tests at elevated temperatures.

FIG. 1 is an exploded perspective view of an embodiment of a wafer surface temperature measurement tool 100. According to the embodiment illustrated in FIG. 1, the tool 100 is substantially cylindrical, with a slightly wider cap 110 and a cylindrical tool body 130 with a tapered portion. The cap 110 serves as a handle for the user and is attached to the top of the tool body 130, as shown in FIG. 1. As shown in FIG. 1, the cap 110 is attached to the top of the tool body 130 by three screws 140 and corresponding threaded holes through the cap 110 and the top surface of the tool body 130. According to an embodiment, the cap 110 can be formed of plastic. In other embodiments, the cap can be formed of other materials, such as, for example, fiberglass, cork, wood, or rubber.

The tool body 130 can be formed of stainless steel. As shown in FIG. 1, the tool body 130 has an inner cylindrical cavity. A stainless steel calibrated weight 120 is slidably disposed within the cavity. As shown in FIG. 1, the calibrated weight 120 fits relatively loosely within the cavity such that the weight 120 can slide within the cavity by the force of gravity. In other embodiments, the weight can be formed of any suitably dense material and the tool body can be formed of any suitably rigid material. FIG. 2A is a side cross-sectional view along the main axis of the tool 100 showing the internal calibrated weight within the tool body 130, and FIG. 2B is a side view of the tool 100. In this embodiment, the internal calibrated weight 120 is formed from a single, integral piece of stainless steel that is machined to form three cylindrical sections along the same primary axis. In a particular embodiment, the weight of the calibrated weight 120 is about 1.25 lbs.

The weight 120 includes a top cylindrical section 120A (which is the largest and heaviest section), a smaller cylindrical mid-section 120B, and a bottom section 120C. As shown in FIG. 2A, the bottom section 120C is a threaded stud for fitting into a threaded orifice through the top surface of a ceramic foot 150 (see FIGS. 1, 3). The larger top section 120A of the internal calibrated weight 120 is made slightly shorter than the corresponding cavity in the tool body 130, so that the entire internal calibrated weight 120 can slide within the cavity. The weight 120 is pulled down by gravity when the tool 100 is held normally (i.e., right side up with the top plastic cap 110 up) or the opposite way when the tool 100 is held upside down. The ceramic foot 150 is attached to the bottom surface of the smaller mid-section 120B of the internal calibrated weight 120 by the threaded stud 120C, which is screwed into the threaded orifice in the ceramic foot 150. The ceramic foot can be angled, as shown in FIG. 3A to allow routing of the electric wires 165 such that the wires 165 can suspend freely without being hampered by any part of the tool. Furthermore, the angling of the foot 150 allows for a smaller footprint.

In the illustrated embodiment, a small, thin, and rectangular resistance temperature device (RTD) or temperature sensor 160 is provided at the bottom of the tool 100 to measure the temperature of the wafer. The temperature sensor 160 is connected via electrical wires to a computer for displaying and/or recording the sensed temperature(s) of the wafer. As shown in FIG. 2A, the temperature sensor 160 is held by the electric wires 165, which are loosely passed through a small opening in the ceramic plate 170. In the embodiment illustrated in FIGS. 2A and 2B, the electric wires 165 extend out of a small opening in the side of the ceramic plate 170 to a computer. The ceramic plate 170 also has a large central hole through which the ceramic foot 150 is screwed to the threaded stud 120C of the internal calibrated weight 120. FIG. 3A is a perspective view of the internal calibrated weight 120 with the ceramic foot 150 attached. FIG. 3B shows the internal calibrated weight 120 without the ceramic foot 150 attached. In this embodiment, the connection of the ceramic foot 150 to the threaded stud 120C of the calibrated weight 120 as well as the screws 175 hold the ceramic plate 170 in place against the tool body 130. The screws 175 are used to attach the plate 170 to the tool body 130. In other embodiments, the temperature sensor can have a different shape. In other embodiments the sensor can be a thermocouple or thermistor.

When the tool 100 is held upside down, the temperature sensor 160 is suspended a few millimeters above the surface of the ceramic foot 150. When the tool 100 is held normally (oriented right side up), the calibrated weight 120 slides downward in the tool body 130 and the attached ceramic foot 150 also slides down enough to push the temperature sensor 160 against the wafer surface while pulling the temperature sensor's electric wires a bit. It will be appreciated that the opening in the ceramic plate 170 through which the electric wires 165 are passed acts as an effective strain relief.

FIG. 4A shows a bottom view and FIG. 4B shows a tilted perspective view of the assembled tool 100. In order to assure stable positioning of the internal calibrated weight 120 on the wafer, three ceramic stands 180 are provided on then ceramic plate 170 in the illustrated embodiment, as shown in FIGS. 4A and 4B. The low thermal conductivity of the ceramic material and small contact area of the stands 180 formed with the underlying wafer minimize any effect on the actual temperature to be measured by the temperature sensor 160.

In the illustrated embodiment, three threaded studs 190 extend through holes in the ceramic plate 170, fitting into threaded orifices in the ceramic stands 180 (FIG. 1). In this embodiment, three screws 175 extend through another set of holes in the ceramic foot 150, and attach the ceramic plate 170 to the bottom surface of the tool body 130, using fitting threaded orifices, respectively. In other embodiments, the stands 180 (as well as the foot 150 and plate 170) can be formed of non-conductive materials, such as, for example, mica, glass, quartz, or stone.

Figure 5:
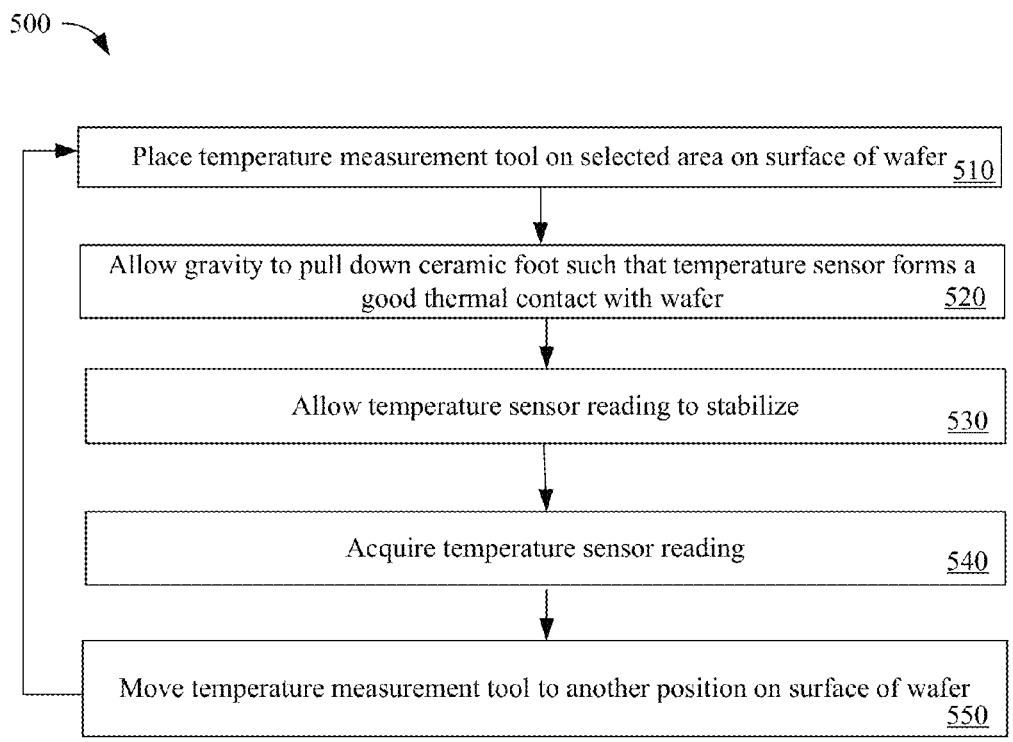
FIG. 5 is a flow chart of a method of temperature calibration performed by using the wafer surface temperature measurement tool.

FIG. 5 is a flow chart of a method 500 of temperature calibration performed by using the wafer surface temperature measurement tool described herein. In 510, the temperature measurement tool is placed on a selected area on the surface of a wafer with ceramic stands contacting the wafer. The tool has a ceramic foot at its bottom with a temperature sensor extending from the bottom surface of the ceramic foot. The ceramic foot is attached to the bottom end of a calibrated weight that is slidably disposed within the body of the tool.

In 520, gravity is allowed to pull down the ceramic foot such that the temperature sensor forms a good thermal contact with the wafer. As gravity pulls down the ceramic foot when the tool is placed on the wafer, the temperature sensor is subjected to a force equal to the weight of the calibrated stainless steel weight internal to the tool body and applied from above by the ceramic foot, while the respective reaction force (same strength but in the opposite direction) pushes its bottom surface up. As a result, the temperature sensor is always maintained by the same forces, using an optimal weight of the internal calibrated stainless steel weight. Thus, when the tool is moved from location to location on the wafer, the same force is applied to the temperature sensor each time because gravity is pulling on the calibrated weight and therefore subjecting the temperature sensor to the weight of the calibrated stainless steel weight rather than a manual force, which can be different each time.

In 530, the temperature sensor reading is allowed to stabilize. Once the temperature reading has stabilized, in 540, the temperature sensor reading is acquired. The acquisition of the temperature reading can be performed by a device, such as a computer. Such a device can be electrically connected to the temperature sensor. In an embodiment, they are electrically connected by electrical wires. As described above, the electrical wires can pass through a portion of the tool, such as the ceramic plate. In other embodiments, the temperature sensor and the computer can be connected wirelessly.

After the temperature reading is acquired, the tool can be moved to another position on the wafer in 550 to acquire the temperature reading at another location on the wafer. Steps 510-550 can be repeated to acquire a temperature map of a wafer. Using the tool described herein, method 500 can generate an accurate, consistent, and reliable areal temperature map of the wafer.

Although only a few embodiments of the invention have been described in detail, it should be appreciated that the invention may be implemented in many other forms without departing from the scope of the invention. It should be apparent that the described wafer temperature measurement tool can be used in a wide variety of applications. In view of all of the foregoing, it should be apparent that the present embodiments are illustrative and not restrictive and the invention is not limited to the details given herein, but may be modified within the scope and equivalents of the appended claims.

What is claimed is:

1. A wafer temperature measurement tool, comprising:
   a tool body;
   a calibrated weight slidably disposed within the tool body, wherein a gravitational force causes the calibrated weight to slide within the tool body;
   a foot attached to a bottom end of the calibrated weight and protruding from a bottom end of the tool body; and
   a temperature sensor extending from a bottom surface of the foot.

2. The wafer temperature measurement tool of claim 1, wherein the calibrated weight is formed of stainless steel.

3. The wafer temperature measurement tool of claim 1, wherein the foot extends protrudes from the tool body and through a plate.

4. The wafer temperature measurement tool of claim 3, wherein a plurality of stands are attached to the plate.

5. The wafer temperature measurement tool of claim 4, wherein the foot, plate, and stands are ceramic.

6. The wafer temperature measurement tool of claim 1, wherein the tool body is cylindrical.

7. The wafer temperature measurement tool of claim 1, wherein the temperature sensor is operably connected to a computer.

8. A method of measuring wafer surface temperature, comprising:
   placing a temperature measurement tool on the wafer, wherein the tool has a calibrated weight slidably disposed within a tool body and a ceramic foot attached to a bottom end of the calibrated weight, and wherein a temperature sensor extends from a bottom surface of the ceramic foot;
   allowing gravity to pull down the ceramic foot such that the temperature sensor thermally contacts the wafer; and
   acquiring a temperature reading from the temperature sensor.

9. The method of claim 8, further comprising moving the temperature measurement tool to a different location on the wafer after acquiring the temperature reading.

10. The method of claim 8, wherein acquiring the temperature reading is performed by a computer.

11. The method of claim 8, wherein the temperature sensor and the computer are operably connected.

12. The method of claim 8, wherein the temperature reading is allowed to stabilize before acquiring the temperature reading.

13. The method of claim 8, wherein the temperature measurement tool further comprises stands on a bottom of the temperature measurement tool and only the stands contact the wafer when the temperature measurement tool is placed on the wafer.

14. A wafer temperature measurement tool, comprising:
   a cylindrical tool body;
   a calibrated weight slidably disposed within the tool body;
   ceramic stands extending from a bottom end of the tool body; and
   a temperature sensor attached to a ceramic foot on a bottom end of the calibrated weight, wherein the ceramic foot and temperature sensor are external to the tool body.

15. The tool of claim 14, wherein the tool is configured such that when the tool is placed on a wafer, the ceramic stands contact the wafer and gravity pulls down the calibrated weight within the tool body such that the temperature sensor contacts the wafer.

16. The tool of claim 14, wherein the calibrated weight is formed of stainless steel.

17. The tool of claim 14, wherein the temperature sensor is operably connected to a computer.

18. The tool of claim 17, wherein the temperature sensor is wirelessly connected to the computer.

19. The tool of claim 17, wherein electrical wires connect the temperature sensor to the computer.

* * * * *